(12) United States Patent
Ono

(10) Patent No.: US 11,283,350 B2
(45) Date of Patent: Mar. 22, 2022

(54) POWER SOURCE SWITCHING DEVICE

(71) Applicant: LAPIS SEMICONDUCTOR CO., LTD., Kanagawa (JP)

(72) Inventor: Tetsuya Ono, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/241,621

(22) Filed: Apr. 27, 2021

(65) Prior Publication Data

US 2021/0336537 A1 Oct. 28, 2021

(30) Foreign Application Priority Data

Apr. 28, 2020 (JP) .............................. JP2020-079549

(51) Int. Cl.
    H03K 17/00 (2006.01)
    H02M 3/155 (2006.01)
    H03K 19/20 (2006.01)

(52) U.S. Cl.
    CPC ............ *H02M 3/155* (2013.01); *H03K 19/20* (2013.01)

(58) Field of Classification Search
    CPC ........ B23K 11/248; B23K 11/243; H02J 3/04; H01R 29/00; H02B 1/24; H03K 17/693; H03K 17/005; H03K 17/74; H03K 17/6257; H04J 3/047
    USPC ............................ 327/407–408; 307/64, 112
    See application file for complete search history.

(56) References Cited

U.S. PATENT DOCUMENTS

| 4,639,614 A | * | 1/1987 | Basile | H03K 3/356008 327/408 |
| 2008/0048500 A1 | * | 2/2008 | Kihara | H03K 17/161 307/80 |
| 2020/0203990 A1 | * | 6/2020 | Fei | H02J 9/061 |

FOREIGN PATENT DOCUMENTS

JP 2004072231 A1 3/2004

* cited by examiner

*Primary Examiner* — Quan Tra
(74) *Attorney, Agent, or Firm* — Volentine, Whitt & Francos, PLLC

(57) ABSTRACT

A power source switching device that includes: a switch connected to a signal input terminal via a first resistor element and configured to fix a potential of the signal input terminal at a predetermined potential by adopting an ON state in a case in which a selection signal is not input; and a switch control circuit configured to perform control to place the switch in an OFF state based on a state signal indicating an operational state of a circuit that operates when supplied with power from a power source selected according to the selection signal in a case in which a potential of the selection signal is different from the predetermined potential, and to perform control to place the switch in the ON state in a case in which the selection signal is not input.

6 Claims, 3 Drawing Sheets

POWER SOURCE SWITCHING DEVICE

CROSS-REFERENCE TO RELATED APPLICATION

This application is based on and claims priority under 35 USC 119 from Japanese Patent Application No. 2020-079549 filed on Apr. 28, 2020, the disclosure of which is incorporated by reference herein.

BACKGROUND

Technical Field

The present disclosure relates to a power source switching device.

Related Art

Japanese Patent Application Laid-Open (JP-A) No. 2004-72231 is an example of known technology for suppressing a current from flowing through a pull-up resistor or a pull-down resistor connected to an input terminal. JP-A No. 2004-72231 describes a semiconductor device including an inbuilt pull-up/pull-down circuit configured to pull up or pull down an input through an input terminal. This semiconductor device includes a switch configured to place an electrical connection between the pull-up/pull-down circuit and a high potential power source or a low potential power source in either an ON or an OFF state, and a switch control circuit configured to perform control to place a switch circuit in an OFF state in cases in which a logic level of an input signal input through the input terminal is the inverse of the logic level of a signal supplied by the high potential power source or the low potential power source.

Power source switching devices that switch an employed power source between plural power sources include a signal input terminal that is input with a selection signal to select one of the plural power sources. In such power source switching devices, a situation may arise in which the signal input terminal is open, such that no selection signal is input. In such cases, the potential of the signal input terminal may fluctuate, causing power source selection operation to become unstable. A pull-down resistor or a pull-up resistor may be used to fix the potential of the signal input terminal at a predetermined potential in cases in which the selection signal is not input. However, in cases in which a pull-down resistor or a pull-up resistor is connected to the signal input terminal, when a selection signal is input at a different potential to the pulled down or pulled up fixed potential, pin leakage occurs in which a leak current flows in the pull-down resistor or the pull-up resistor through the signal input terminal, resulting in increased in power consumption.

SUMMARY

An aspect of the present disclosure is a power source switching device that includes a signal input terminal configured to be input with a selection signal to select any one power source among plural power sources, a power source switching circuit configured to switch the power source connected to a power source output node based on the selection signal, a switch connected to the signal input terminal via a first resistor element and configured to fix a potential of the signal input terminal at a predetermined potential by adopting an ON state in a case in which the selection signal is not input, and a switch control circuit configured to perform control to place the switch in an OFF state based on a state signal indicating an operational state of a circuit that operates when supplied with power from the power source selected according to the selection signal in a case in which a potential of the selection signal is different from the predetermined potential, and to perform control to place the switch in the ON state in a case in which the selection signal is not input.

DETAILED DESCRIPTION

Figure 1:
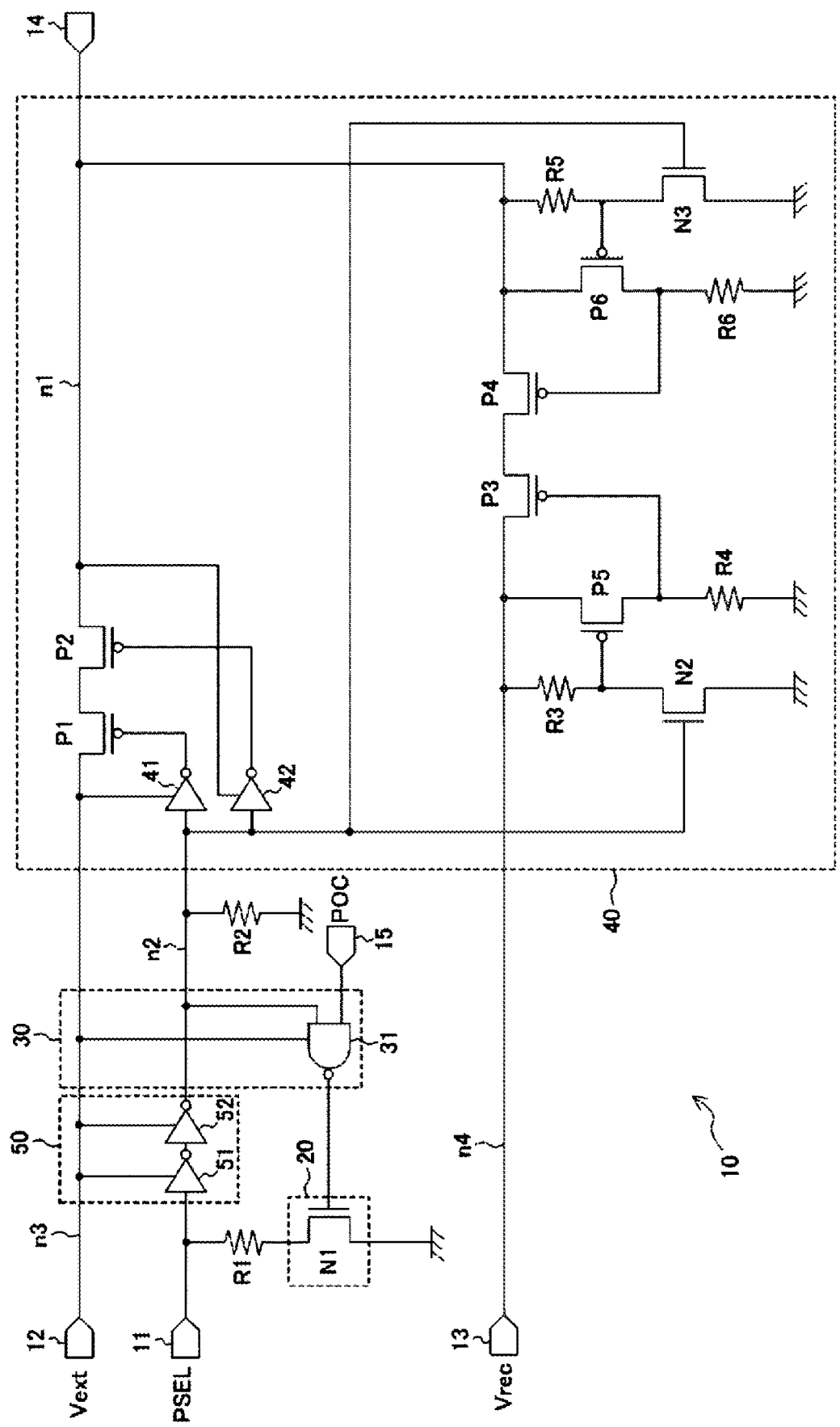
FIG. 1 is a diagram illustrating an example of a configuration of a power source switching device according to a first exemplary embodiment of the present disclosure.

Explanation follows regarding examples of exemplary embodiments of the present disclosure, with reference to the drawings. Note that the same or equivalent configuration elements and sections are allocated the same reference numerals in each of the drawings, and duplicate explanation thereof will be omitted.

First Exemplary Embodiment

FIG. 1 is a diagram illustrating an example of a configuration of a power source switching device 10 according to a first exemplary embodiment of the present disclosure. The power source switching device 10 is provided with functionality to selectively connect plural power sources to a power source output node n1 based on a selection signal PSEL input to a signal input terminal 11. For example, one of the plural power sources is an external power source device (not illustrated in the drawings) connected to a first power source input terminal 12, and another of the plural power sources is a rectifier connected to a second power source input terminal 13. The power source switching device 10 includes the signal input terminal 11, a resistor element R1, a switch 20, a switch control circuit 30, and a power source switching circuit 40.

The selection signal PSEL for selecting one of the plural power sources is input to the signal input terminal 11. In the present exemplary embodiment, the external power source device connected to the first power source input terminal 12 is selected in cases in which the potential of the selection signal PSEL is at a power source level (high level). The rectifier connected to the second power source input terminal 13 is selected in cases in which the potential of the selection signal PSEL is at a ground level (low level).

The resistor element R1 functions as a pull-down resistor that pulls down the signal input terminal 11. One end of the resistor element R1 is connected to the signal input terminal 11, and the other end of the resistor element R1 is connected to the switch 20. The resistor element R1 is an example of a first resistor element of the present disclosure.

The switch 20 is, for example, configured by an n-channel transistor N1. A drain of the transistor N1 is connected to the other end of the resistor element R1, a source of the transistor N1 is connected to a ground line, and a gate of the transistor N1 is connected to an output terminal of a NAND circuit 31 configuring the switch control circuit 30. Namely, the switch 20 is connected to the signal input terminal 11 via the resistor element R1, and placing the switch 20 in an ON state fixes the potential of the signal input terminal 11 at the ground level.

The power source switching device 10 includes a buffer circuit 50 configured by serially connected NOT circuits 51, 52. An input terminal of the buffer circuit 50 (input terminal of the NOT circuit 51) is connected to the signal input terminal 11. An output terminal of the buffer circuit 50 (output terminal of the NOT circuit 52) is connected to an intermediate node n2. Power source input terminals of the NOT circuits 51, 52 are connected to a first power source input node n3 connected to the first power source input terminal 12. In cases in which the potential of the selection signal PSEL input to the signal input terminal 11 is at the power source level (high level), the buffer circuit 50 outputs an output signal to the intermediate node n2 at the same potential as the potential of a power source voltage Vext supplied from the external power source device connected to the first power source input terminal 12 (i.e. a high level output signal). In cases in which the potential of the selection signal PSEL input to the signal input terminal 11 is at the ground level (low level), the buffer circuit 50 outputs an output signal to the intermediate node n2 at the ground level (low level).

One end of a resistor element R2 is connected to the intermediate node n2. The other end of the resistor element R2 is connected to a ground line. The resistor element R2 is an example of a second resistor element of the present disclosure.

The power source switching circuit 40 is configured including NOT circuits 41, 42, p-channel transistors P1 to P6, n-channel transistors N2, N3, and resistor elements R3 to R6. An input terminal of the NOT circuit 41 is connected to the intermediate node n2, an output terminal of the NOT circuit 41 is connected to a gate of the transistor P1, and a power source input terminal of the NOT circuit 41 is connected to the first power source input node n3. An input terminal of the NOT circuit 42 is connected to the intermediate node n2, an output terminal of the NOT circuit 42 is connected to a gate of the transistor P2, and a power source input terminal of the NOT circuit 42 is connected to the power source output node n1. A source of the transistor P1 is connected to the first power source input node n3, and a drain of the transistor P1 is connected to a drain of the transistor P2. A source of the transistor P2 is connected to the power source output node n1.

One end of the resistor element R3 is connected to a second power source input node n4, and the other end of the resistor element R3 is connected to a drain of the transistor N2 and to a gate of the transistor P5. A source of the transistor N2 is connected to a ground line, and a gate of the transistor N2 is connected to the intermediate node n2. A source of the transistor P5 is connected to the second power source input node n4, and a drain of the transistor P5 is connected to one end of the resistor element R4 and to a gate of the transistor P3. The other end of the resistor element R4 is connected to a ground line. A source of the transistor P3 is connected to the second power source input node n4, and a drain of the transistor P3 is connected to a drain of the transistor P4.

One end of the resistor element R5 is connected to the power source output node n1, and the other end of the resistor element R5 is connected to a drain of the transistor N3 and to a gate of the transistor P6. A source of the transistor N3 is connected to a ground line, and a gate of the transistor N3 is connected to the intermediate node n2. A source of the transistor P6 is connected to the power source output node n1, and a drain of the transistor P6 is connected to one end of the resistor element R6 and to the gate of the transistor P4. The other end of the resistor element R6 is connected to a ground line. A source of the transistor P4 is connected to the power source output node n1, and the drain of the transistor P4 is connected to the drain of the transistor P3.

The power source switching circuit 40 switches the power source connected to the power source output node n1 based on the selection signal PSEL. For example, in cases in which the external power source device connected to the first power source input terminal 12 has been selected based on the selection signal PSEL, the first power source input node n3 is connected to the power source output node n1. In such cases, the power source voltage Vext from the external power source device input to the first power source input terminal 12 is output from a power source output terminal 14 connected to the power source output node n1 as an output voltage Vout. On the other hand, in cases in which the rectifier connected to the second power source input terminal 13 has been selected based on the selection signal PSEL, the second power source input node n4 is connected to the power source output node n1. In such cases, a power source voltage Vrec input to the second power source input terminal 13 from the rectifier is output from the power source output terminal 14 as the output voltage Vout.

A non-illustrated internal circuit is connected to the power source output terminal 14. The internal circuit operates when supplied with the output voltage Vout output from the power source output terminal 14. The switch control circuit 30 is input with a state signal POC indicating an operational state of the internal circuit. In the present exemplary embodiment, the potential of the state signal POC is at the ground level (low level) until the operational state of the internal circuit achieves a stable state, and is at the potential of the output voltage Vout (high level) when the operational state of the internal circuit has achieved a stable state. The internal circuit may for example be a regulator that generates an internal voltage with a different potential to the potential of the output voltage Vout, and the potential of the state signal POC may become high level in cases in which the potential of the internal voltage has reached a predetermined level and stabilized. The internal circuit and the power source switching device 10 may both be mounted on a single semiconductor substrate.

The switch control circuit 30 controls the switch 20 based on the state signal POC. The switch control circuit 30 is configured including the NAND circuit 31. One input terminal of the NAND circuit 31 is connected to the intermediate node n2, and another input terminal of the NAND circuit 31 is connected to a signal input terminal 15 that is input with the state signal POC. An output terminal of the NAND circuit 31 is connected to the gate of the transistor N1 configuring a control terminal of the switch 20, and a power source input terminal of the NAND circuit 31 is connected to the first power source input node n3. Note that the NAND circuit 31 is an example of a logic circuit of the present disclosure.

The switch control circuit 30 outputs a ground level (low level) signal in cases in which the potential of the selection signal PSEL is the power source level (high level) and the potential of the state signal POC is also the power source level (high level). In such cases, the transistor N1 configuring the switch 20 is placed in an OFF state. On the other hand, the switch control circuit 30 outputs a power source level (high level) signal in cases in which the potentials of the selection signal PSEL and the state signal POC are in any combination other than the above. In such cases, the transistor N1 configuring the switch 20 is placed in an ON state.

Note that metal oxide semiconductor field-effect transistors (MOSFETs) may be employed as the respective transistors N1 to N3 and P1 to P6 configuring the power source switching device 10; however, there is no limitation thereto. For example, bipolar junction transistors may be employed therefor.

Explanation follows regarding operation of the power source switching device 10 in each of a first case to a fifth case.

(1) Vext Applied, Vrec Applied, PSEL High Level

In the first case, the power source voltage Vext from the external power source device is input to the first power source input terminal 12, the power source voltage Vrec from the rectifier is input to the second power source input terminal 13, and the selection signal PSEL input to the signal input terminal 11 is at the power source level (high level). Note that in an initial state, the internal circuit is assumed to be inactive, and the potential of the state signal POC is assumed to be at the ground level (low level). Accordingly, in the initial state, the potential of the output signal of the NAND circuit 31 is at the power source level (high level), and the transistor N1 is in the ON state. Since the transistor N1 is in the ON state, current flows through the resistor element R1. Namely, in the initial state, pin leakage occurs in which current flows into the signal input terminal 11.

In the first case, since a power source level (high level) selection signal PSEL is input to the signal input terminal 11, the potential of the intermediate node n2 is at the power source level (high level). Accordingly, the output signals of the NOT circuits 41, 42 are at the ground level (low level), and the transistors P1, P2 are both in the ON state. Moreover, the transistors N2, N3 are both in the ON state and the transistors P5, P6 are both in the ON state, and the transistors P3, P4 are accordingly both in the OFF state. The power source output node n1 is thus connected to the first power source input node n3, and disconnected from the second power source input node n4. Namely, the power source output node n1 is connected to the external power source device connected to the first power source input terminal 12, and the power source voltage Vext from the external power source device is output from the power source output terminal 14 as the output voltage Vout.

When the operational state of the internal circuit that operates when supplied with the output voltage Vout stabilizes, the potential of the state signal POC becomes the power source level (high level). The potential of the output signal of the NAND circuit 31 accordingly transitions to the ground level (low level). The transistor N1 is accordingly placed in the OFF state, thereby eliminating the pin leakage at the signal input terminal 11.

Figure 2:
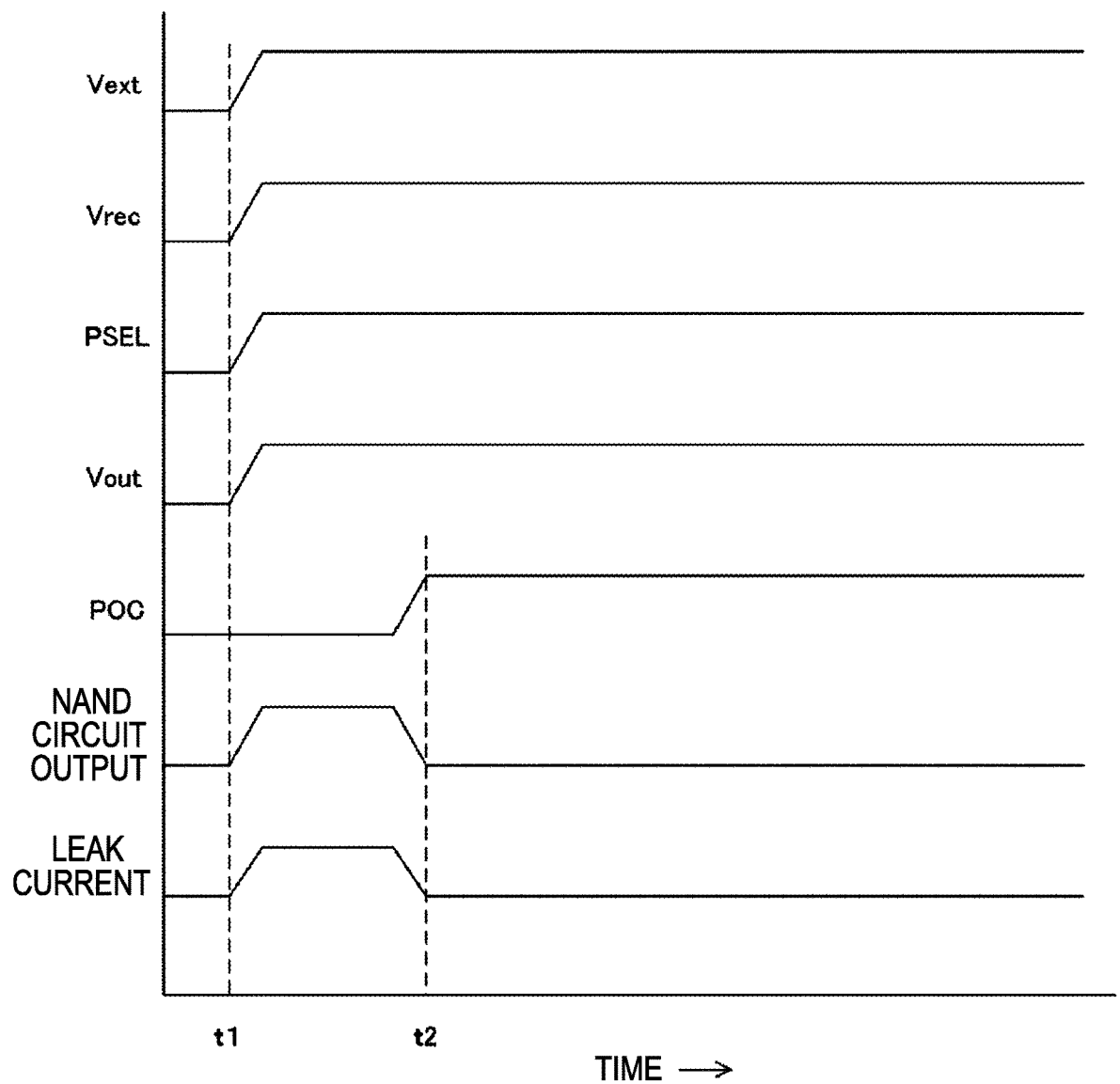
FIG. 2 is a timing chart illustrating an example of operation of a power source switching device according to the first exemplary embodiment of the present disclosure.

FIG. 2 is a timing chart illustrating an example of operation of the power source switching device 10 in the first case. As illustrated in FIG. 2, at a timing t1, the output voltage Vout is supplied to the internal circuit, and at a timing t2, the operational state of the internal circuit stabilizes and the potential of the state signal POC becomes the power source level (high level). During the interval between the timing t1 and the timing t2, the potential of the output signal of the NAND circuit 31 becomes the power source level (high level), and although a leak current flows through the resistor element R1 during this interval, from the timing t2 onward the potential of the output signal of the NAND circuit 31 becomes the ground level (low level), and the leak current (the pin leakage at the signal input terminal 11) is eliminated. Since the interval from the timing t1 to the timing t2 is comparatively short, the amount of power consumed during this interval is negligible.

(2) Vext Applied, Vrec Applied, PSEL Low Level

In the second case, the power source voltage Vext from the external power source device is input to the first power source input terminal 12, the power source voltage Vrec from the rectifier is input to the second power source input terminal 13, and the selection signal PSEL input to the signal input terminal 11 is at the ground level (low level). Note that in an initial state, the internal circuit is assumed to be inactive, and the potential of the state signal POC is assumed to be at the ground level (low level). Accordingly, in the initial state, the potential of the output signal of the NAND circuit 31 is at the power source level (high level), and the transistor N1 is in the ON state. In the second case, since the potential of the selection signal PSEL is at the ground level (low level), a leak current does not flow through the resistor element R1 even though the transistor N1 is in the ON state. Namely, in the second case, pin leakage does not occur at the signal input terminal 11.

In the second case, since a ground level (low level) selection signal PSEL is input to the signal input terminal 11, the potential of the intermediate node n2 is at the ground level (low level). Accordingly, the output signals of the NOT circuits 41, 42 are at the power source level (high level), and the transistors P1, P2 are both in the OFF state. Moreover, the transistors N2, N3 are both in the OFF state and the transistors P5, P6 are both in the OFF state, and the transistors P3, P4 are accordingly both in the ON state. The power source output node n1 is thus connected to the second power source input node n4, and disconnected from the first power source input node n3. Namely, the power source output node n1 is connected to the rectifier connected to the second power source input terminal 13, and the power source voltage Vrec from the rectifier is output from the power source output terminal 14 as the output voltage Vout.

When the operational state of the internal circuit that operates when supplied with the output voltage Vout stabilizes, the potential of the state signal POC becomes the power source level (high level). However, since the potential of the intermediate node n2 is at the ground level (low level), the potential of the output signal of the NAND circuit 31 is maintained at the ground level (low level). The transistor N1 is accordingly maintained in the ON state. Since the potential of the selection signal PSEL is at the ground level (low level), a leak current does not flow through the resistor element R1 even though the transistor N1 is in the ON state.

(3) Vext Applied, Vrec Applied, PSEL Open

In the third case, the power source voltage Vext from the external power source device is input to the first power source input terminal 12, the power source voltage Vrec from the rectifier is input to the second power source input terminal 13, and the signal input terminal 11 is open (such that the selection signal PSEL is not input). Note that in an initial state, the internal circuit is assumed to be inactive, and the potential of the state signal POC is assumed to be at the ground level (low level). Accordingly, in the initial state, the potential of the output signal of the NAND circuit 31 is at the power source level (high level), and the transistor N1 is in the ON state. In the third case, since the signal input terminal 11 is open, a leak current does not flow through the resistor element R1 even though the transistor N1 is in the ON state.

In the third case, the transistor N1 is in the ON state, and the potential of the signal input terminal 11 is fixed at the ground level (low level) by the resistor element R1 functioning as a pull-down resistor. Accordingly, similarly to in the second case, the power source output node n1 is connected to the rectifier connected to the second power source input terminal 13, and the power source voltage Vrec from the rectifier is output from the power source output terminal 14 as the output voltage Vout.

When the operational state of the internal circuit that operates when supplied with the output voltage Vout stabilizes, the potential of the state signal POC becomes the power source level (high level). However, since the potential of the intermediate node n2 is at the ground level (low level), the potential of the output signal of the NAND circuit 31 is maintained at the ground level (low level). The transistor N1 is accordingly maintained in the ON state. Since the signal input terminal 11 is open, a leak current does not flow through the resistor element R1 even though the transistor N1 is in the ON state. Namely, pin leakage does not occur at the signal input terminal 11.

(4) Vext Open, Vrec Applied, PSEL Low Level

In the fourth case, the first power source input terminal 12 is open (the power source voltage Vext is not input), the power source voltage Vrec from the rectifier is input to the second power source input terminal 13, and the selection signal PSEL input to the signal input terminal 11 is at the ground level (low level). In the fourth case, since there is no power source supply to the NAND circuit 31, the NAND circuit 31 is unable to drive the transistor N1. Accordingly, the transistor N1 is maintained in an OFF state. Moreover, there is no power source supply to the NOT circuits 51, 52.

In the fourth case, the potential of the intermediate node n2 is fixed at the ground level (low level) by the resistor element R2. Accordingly, similarly to in the second case, the power source output node n1 is connected to the rectifier connected to the second power source input terminal 13, and the power source voltage Vrec from the rectifier is output from the power source output terminal 14 as the output voltage Vout. In the fourth case, since the transistor N1 is maintained in the OFF state, a leak current does not flow through the resistor element R1. Namely, pin leakage does not occur at the signal input terminal 11.

(5) Vext Open, Vrec Applied, PSEL Open

In the fifth case, the first power source input terminal 12 is open (the power source voltage Vext is not input), the power source voltage Vrec from the rectifier is input to the second power source input terminal 13, and the signal input terminal 11 is open (the selection signal PSEL is not input). In the fifth case, similarly to in the fourth case, the potential of the intermediate node n2 is fixed at the ground level (low level) by the resistor element R2. Accordingly, similarly to in the second case, the power source output node n1 is connected to the rectifier connected to the second power source input terminal 13, and the power source voltage Vrec from the rectifier is output from the power source output terminal 14 as the output voltage Vout. In the fifth case, similarly to in the fourth case, since the transistor N1 is maintained in the OFF state, a leak current does not flow through the resistor element R1. Namely, pin leakage does not occur at the signal input terminal 11.

As described above, the power source switching device 10 according to the present exemplary embodiment of the present disclosure includes the signal input terminal 11 that is input with the selection signal PSEL to select any one power source from out of the plural power sources, the power source switching circuit 40 that switches the power source connected to the power source output node n1 based on the selection signal PSEL, and the switch 20 that is connected to the signal input terminal 11 via the resistor element R1 and that fixes the potential of the signal input terminal 11 at the ground level by adopting an ON state. The power source switching device 10 further includes the switch control circuit 30. The switch control circuit 30 performs control to place the switch 20 in the OFF state based on the state signal POC in cases in which the potential of the selection signal PSEL is the power source level (high level), this being higher than the ground level. The switch control circuit 30 also performs control to place the switch 20 in the ON state in cases in which the selection signal PSEL is not input.

The power source switching device 10 according to the first exemplary embodiment of the present disclosure is capable of switching the power source employed between plural power sources according to the selection signal PSEL. Moreover, in cases in which the selection signal PSEL is not input, namely in cases in which the signal input terminal 11 is open, the switch 20 is placed in the ON state by the switch control circuit 30, and the potential of the signal input terminal 11 is fixed at the ground level by the resistor element R1 functioning as a pull-down resistor. This enables instability of a power source selection operation of the power source switching circuit 40 to be prevented.

In cases in which a power source level (high level) selection signal PSEL is input to the signal input terminal 11, although a leak current does briefly flow through the resistor element R1 that functions as a pull-down resistor, since the switch control circuit 30 performs control to place the switch 20 in the OFF state based on the state signal POC, this leak current can be prevented from flowing into the resistor element R1 continuously. Namely, the power source switching device 10 according to the first exemplary embodiment of the present disclosure is capable of suppressing current leakage (pin leakage) accompanying pull-down of the signal input terminal 11. Moreover, the switch control circuit 30 also performs control to place the switch 20 in the OFF state once the internal circuit has attained a stable state, thereby enabling the switch 20 to be made to transition to the OFF state at an appropriate timing.

Second Exemplary Embodiment

Figure 3:
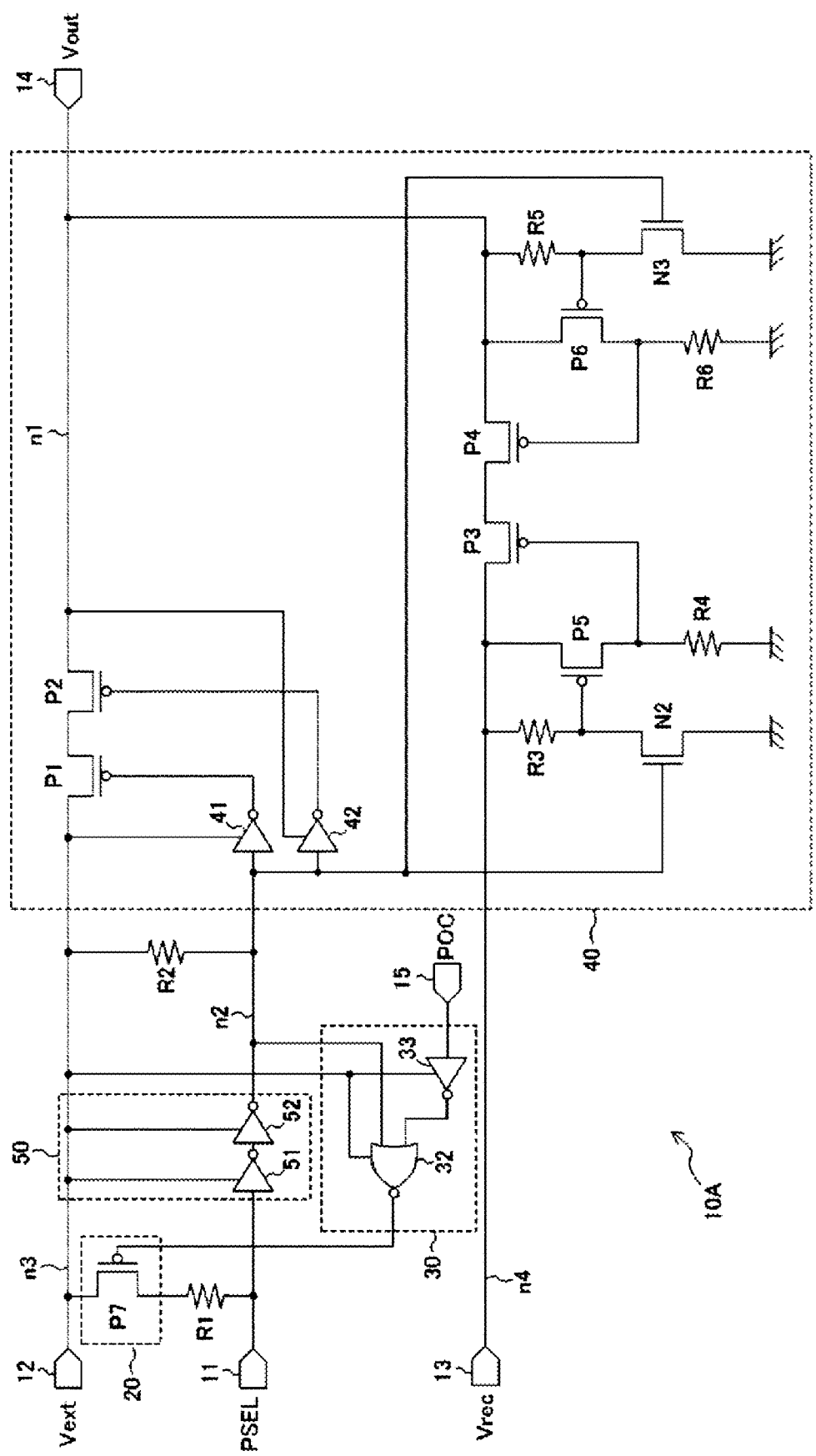
FIG. 3 is a diagram illustrating an example of a configuration of a power source switching device according to a second exemplary embodiment of the present disclosure.

FIG. 3 is a diagram illustrating an example of a configuration of a power source switching device 10A according to a second exemplary embodiment of the present disclosure. In the power source switching device 10 according to the first exemplary embodiment described above, the potential of the signal input terminal 11 is fixed at the ground level by the resistor element R1 functioning as a pull-down resistor in cases in which the selection signal PSEL is not input. In contrast thereto, in the power source switching device 10A according to the second exemplary embodiment, the potential of the signal input terminal 11 is fixed at the power source level by the resistor element R1 functioning as a pull-up resistor in cases in which the selection signal PSEL is not input.

In the power source switching device 10A, the switch 20 is configured by a p-channel transistor P7. A source of the transistor P7 is connected to the first power source input node n3, and a drain of the transistor P7 is connected to the one end of the resistor element R1. The other end of the resistor element R1 is connected to the signal input terminal 11.

In the power source switching device 10A, the switch control circuit 30 is configured by a NOR circuit 32 and a NOT circuit 33. An input terminal of the NOT circuit 33 is connected to the signal input terminal 15 input with the state signal POC. An output terminal of the NOT circuit 33 is connected to one input terminal of the NOR circuit 32. Another input terminal of the NOR circuit 32 is connected to the intermediate node n2, and an output terminal of the NOR circuit 32 is connected a gate of the transistor P7, this being the control terminal of the switch 20. Power source input terminals of the NOR circuit 32 and the NOT circuit 33 are connected to the first power source input node n3. The one end of the resistor element R2 is connected to the first power source input node n3, and the other end of the resistor element R2 is connected to the intermediate node n2. Other than in the configurations mentioned above, the of the power source switching device 10A has the same configuration as that of the power source switching device 10 according to the first exemplary embodiment.

Similarly to the power source switching device 10 according to the first exemplary embodiment, in the power source switching device 10A according to the second exemplary embodiment, in cases in which the potential of the selection signal PSEL is at the power source level (high level), the power source output node n1 is connected to the external power source device connected to the first power source input terminal 12, and the power source voltage Vext from the external power source device is output from the power source output terminal 14 as the output voltage Vout. In cases in which the potential of the selection signal PSEL is at the power source level (high level), a leak current does not flow through the resistor element R1, even when the transistor P1 is in the ON state.

In cases in which the potential of the selection signal PSEL is at the ground level (low level), in an initial state the potential of the output signal of the NOR circuit 32 is at the ground level (low level), and the transistor P7 is placed in the ON state. Since the transistor P7 is in the ON state, a leak current flows through the resistor element R1. Namely, pin leakage occurs in which current flows out through the signal input terminal 11. In cases in which the potential of the selection signal PSEL is at the ground level (low level), the power source output node n1 is connected to the rectifier connected to the second power source input terminal 13, and the power source voltage Vrec from the rectifier is output from the power source output terminal 14 as the output voltage Vout.

When the operational state of the internal circuit that operates when supplied with the output voltage Vout stabilizes, the potential of the state signal POC becomes the power source level (high level). The potential of the output signal of the NOR circuit 32 accordingly transitions to the power source level (high level). The transistor P7 is accordingly placed in the OFF state, thereby eliminating the pin leakage at the signal input terminal 11.

In cases in which the signal input terminal 11 is open (such that the selection signal PSEL is not input), the transistor P7 is placed in the ON state, and the potential of the signal input terminal 11 is fixed at the power source level (high level) by the resistor element R1 functioning as a pull-up resistor. Accordingly, similarly to in the first case described above, the power source output node n1 is connected to the external power source device connected to the first power source input terminal 12, and the power source voltage Vext from the external power source device is output from the power source output terminal 14 as the output voltage Vout.

As described above, the power source switching device 10A according to the second exemplary embodiment of the present disclosure, similarly to the power source switching device 10 according to the first exemplary embodiment, is capable of switching the power source employed between plural power sources according to the selection signal PSEL. Moreover, in cases in which the selection signal PSEL is not input, namely in cases in which the signal input terminal 11 is open, the switch 20 is placed in the ON state by the switch control circuit 30, and the potential of the signal input terminal 11 is fixed at the power source level (Vext) by the resistor element R1 functioning as a pull-up resistor. This enables instability of a power source selection operation of the power source switching circuit 40 to be prevented.

In cases in which a ground level (low level) selection signal PSEL is input to the signal input terminal 11, although a leak current does briefly flow through the resistor element R1 that functions as a pull-up resistor, since the switch control circuit 30 performs control to place the switch 20 in the OFF state based on the of the state signal POC, this leak current can be prevented from flowing into the resistor element R1 continuously. Namely, the power source switching device 10 according to the second exemplary embodiment of the present disclosure is capable of suppressing current leakage (pin leakage) accompanying pull-up of the signal input terminal 11.

Note that although the foregoing explanation employs examples of cases in which two power sources are selectively employed, a power source switching device may be configured to selectively employ three or more power sources. Moreover, although explanation has been given regarding examples in which an external power source device and a rectifier serve as the power sources connected to the power source switching device, there is no limitation thereto, and any power source may be applied as a power source connected to the power source switching device according to the present disclosure.

Although explanation has been given regarding examples in which a regulator is applied as the internal circuit whose operational state is indicated by the state signal POC, there is no limitation thereto, and any type of circuit may be applied as the internal circuit whose operational state is indicated by the state signal POC. Moreover, although explanation has been given regarding an example in which control is performed to place the switch 20 in the OFF state in cases in which the operational state of the internal circuit as indicated by the state signal POC is in a stable state, there is no limitation thereto, and control may be performed to place the switch 20 in the OFF state in cases in which the operational state of the internal circuit as indicated by the state signal POC has attained a specified state other than a stable state.

Although explanation has been given regarding examples in which the NAND circuit 31 and the NOR circuit 32 serve as logic circuits configuring the switch control circuit 30, there is no limitation thereto. The allocation of logic values with respect to states of an internal circuit as indicated by the state signal POC may be set as desired, and logic circuits configuring the switch control circuit 30 may be configured as appropriate according to the allocation of such logic values.

An object of the present disclosure is to suppress current leakage (pin leakage) from occurring when a signal input terminal is pulled down or pulled up.

A power source switching device according to the present disclosure includes a signal input terminal configured to be input with a selection signal to select any one power source from out of plural power sources, a power source switching circuit configured to switch the power source connected to a power source output node based on the selection signal, a switch connected to the signal input terminal via a first resistor element and configured to fix a potential of the signal input terminal at a predetermined potential by adopting an ON state in cases in which the selection signal is not input, and a switch control circuit configured to perform control to place the switch in an OFF state based on a state signal indicating an operational state of a circuit that operates when supplied with power from the power source selected according to the selection signal in cases in which a potential of the selection signal is different to the predetermined potential, and to perform control to place the switch in the ON state in cases in which the selection signal is not input.

Advantageous Effects of Invention

The present disclosure is capable of suppressing current leakage (pin leakage) from occurring when a signal input terminal is pulled down or pulled up.

The invention claimed is:

1. A power source switching device comprising:
a signal input terminal configured to be input with a selection signal to select any one power source among a plurality of power sources;
a power source switching circuit configured to switch the power source connected to a power source output node based on the selection signal;
a switch connected to the signal input terminal via a first resistor element and configured to fix a potential of the signal input terminal at a predetermined potential by adopting an ON state in a case in which the selection signal is not input; and
a switch control circuit configured to perform control to place the switch in an OFF state based on a state signal indicating an operational state of a circuit that operates when supplied with power from the power source selected according to the selection signal in a case in which a potential of the selection signal is different from the predetermined potential, and to perform control to place the switch in the ON state in a case in which the selection signal is not input.

2. The power source switching device of claim 1, wherein the switch control circuit is configured to control to place the switch in the OFF state in a case in which the operational state of the circuit indicated by the state signal is a stable state.

3. The power source switching device of claim 1, wherein the switch control circuit includes a logic circuit with one input terminal configured to be input with a potential of an intermediate node having a potential that changes according to the selection signal, with another input terminal configured to be input with the state signal, and with an output terminal connected to a control terminal of the switch.

4. The power source switching device of claim 3, further comprising a second resistor element with one end connected to the intermediate node and with another end connected to the predetermined potential.

5. The power source switching device of claim 3, wherein:
the predetermined potential is at a ground level;
a potential of the state signal is at the ground level until an operational state of the circuit attains a stable state, and the potential of the state signal transitions to a higher level than the ground level in a case in which the operational state of the circuit has attained the stable state;
the logic circuit includes a NAND circuit; and
the switch is an n-channel transistor.

6. The power source switching device of claim 3, wherein:
the predetermined potential is a higher level than a ground level;
a potential of the state signal is at the ground level until an operational state of the circuit attains a stable state, and the potential of the state signal transitions to a higher level than the ground level in a case in which the operational state of the circuit has attained the stable state;
the logic circuit includes a NOR circuit; and
the switch is a p-channel transistor.

* * * * *